United States Patent [19]

Heuber et al.

[11] Patent Number: 4,521,873
[45] Date of Patent: Jun. 4, 1985

[54] METHOD OF AND CIRCUIT ARRANGEMENT FOR READING AN INTEGRATED SEMICONDUCTOR STORE WITH STORAGE CELLS IN MTL (I²L) TECHNOLOGY

[75] Inventors: Klaus Heuber, Böblingen; Siegfried K. Wiedmann, Stuttgart, both of Fed. Rep. of Germany

[73] Assignee: International Business Machines Corporation, Armonk, N.Y.

[21] Appl. No.: 414,122

[22] Filed: Sep. 2, 1982

[30] Foreign Application Priority Data

Oct. 30, 1981 [EP] European Pat. Off. ...... 81 109 368.1

[51] Int. Cl.³ .............................................. G11C 7/00
[52] U.S. Cl. .................................... 365/190; 365/154
[58] Field of Search ................ 365/154, 189, 190, 156

[56] References Cited

U.S. PATENT DOCUMENTS 4,259,730  3/1981  Heuber et al. ...................... 365/156
4,397,002  8/1983  Brosch et al. ...................... 365/190

OTHER PUBLICATIONS

K. Heuber et al., "Read/Write Circuitry", IBM Tech. Disclosure Bulletin, vol. 22, No. 9, Feb. 1980, pp. 4104–4105.

Primary Examiner—Joseph A. Popek
Attorney, Agent, or Firm—Wesley DeBruin

[57] ABSTRACT

A method of and a circuit arrangement for reading an integrated MTL(I²L) store are described, wherein prior to or during a read operation, line capacities are discharged and in addition to the word line drivers and the bit line drivers, a read/write circuit is provided. Simultaneously with the selection of a word line (WL) or with a slight time delay (t1), two identical current sources (IRD0) are connected by means of two switches (S0 and S1) to the relevant bit lines (B0 and B1). As a result, the two injectors of the two bit line PNP transistors (T1 and T4) are supplied with the same currents. In a second phase (t2), the current sources (IRD0) are switched off so that the duration of the second time phase (t2) considerably exceeds the storage time constant ($\tau e$) of the bit line PNP transistor (T4) connected to the switched "OFF" NPN transistor (T3) of a cell. The effective storage time constant ($\tau SAT$) of the bit line PNP transistor (T1), connected to the switched on NPN cell transistor (T2), considerably exceeds the storage time constant ($\tau e$). As a result of the different time constants ($\tau e$ and $\tau SAT$), the two storage charges (Q1 and Q4) are discharged at different rates during the third phase (t3), thus generating a very fast and high output signal ($\Delta VBL = VS$).

2 Claims, 6 Drawing Figures

METHOD OF AND CIRCUIT ARRANGEMENT FOR READING AN INTEGRATED SEMICONDUCTOR STORE WITH STORAGE CELLS IN MTL (I²L) TECHNOLOGY

FIELD OF THE INVENTION

The invention concerns a method of reading an integrated semiconductor store employing MTL (I²L) storage cells and a circuit arrangement for implementing the method.

BACKGROUND OF THE INVENTION AND PRIOR ART

From German Auslegeschrift No. 25 11 518 a method and a circuit arrangement are known for operating an integrated semiconductor store, whose cells consist of flip-flops with bipolar transistors and Schottky diodes as read/write coupling elements. [German Austegeschrift No. 25 11 518 corresponds to U.S. Pat. No. 4,090,255, entitled "Circuit Arrangement For Operating A Semiconductor Memory System", granted May 16, 1978 to H. H. Berger et al.] The load elements of the flip-flops are highly resistive resistors or transistors switched as current sources. The read/write cycles of the storage cells are performed in several phases, and the cells are selected in response to level changes on word and bit lines. For increasing the read or the write speed and for reducing the power dissipation, the bit lines are discharged to ground by the conductive storage cell transistors. During the read phase of the store, the bit lines are charged only slightly, so that the charging current flowing through the storage cell is very low.

In recent years there has been a brisk development in the field of logic circuits and integrated semiconductor technology with bipolar transistors, which under the term MTL (Merged Transistor Logic) or IIL (Integrated Injection Logic) has become well known in the literature. Attention is drawn to the articles in IEEE Journal of Solid State Circuits, Vol. SC/7, No. 5, October 1972, page 340 and subsequent pages. Relevant solutions have also become known from U.S. Pat. Nos. 3,736,477 and 3,816,758. Reference is made to the following prior art patents and publications, at least a number of which relate to I²L type memory circuitry. It is to be appreciated with reference to the subject invention, that the following art is not necessarily the only prior art, the best prior art, or the most pertinent prior art.

U.S. Pat. No. 3,643,231 entitled "Monolithic Associative Memory Cell" granted Feb. 15, 1972 to F. H. Lohrey and S. K. Wiedmann, and of common assignee herewith.

U.S. Pat. No. 3,736,477 entitled "Monolithic Semiconductor Circuit Concept of High Packing Density" granted May 29, 1973 to H. H. Berger and S. K. Wiedmann and of common assignee herewith.

U.S. Pat. No. 3,815,106 entitled "Flip-Flop Memory Cell Arrangement" granted June 4, 1979 to S. K. Wiedmann, and of common assignee herewith.

U.S. Pat. No. 3,816,758 entitled "Digital Logic Circuit" granted June 11, 1974 to H. H. Berger and S. K. Wiedmann, and of common assignee herewith.

U.S. Pat. No. 3,886,531 entitled "Schottky Loaded Emitter Coupled Memory Cell For Random Access Memory" granted May 27, 1975 to J. L. McNeill.

U.S. Pat. No. 3,993,918 entitled "Integrated Circuits" granted Nov. 23, 1976 to A. W. Sinclair.

U.S. Pat. No. 4,021,786 entitled "Memory Cell Circuit and Semiconductor Structure Therefore" granted May 3, 1977 to H. W. Peterson.

U.S. Pat. No. 4,090,255 entitled "Circuit Arrangement For Operating a Semiconductor Memory System" granted May 16, 1978 to H. H. Berger et al., and of common assignee herewith.

IBM Technical Disclosure Bulletin publication entitled "MTL Storage Cell" by S. K. Wiedmann, Vol. 21, No. 1 June 1978, pages 231-2.

"Merged-Transistor Logic (MTL)—A Low-Cost Bipolar Logic Concept" by Horst H. Berger and Siegfried K. Wiedmann, IEEE Journal of Solid-State Circuits, Vol. SC-7, No. 5, Oct. 1972, pages 340-6.

"Integrated Injection Logic: A New Approach to LSI" By Kees Hart and Arie Slob, IEEE Journal of Solid-State Circuits, Vol. SC-7, No. 5, October 1972, pages 346-51.

From U.S. Pat. No. 4,090,255 a method and a circuit arrangement for driving an integrated semiconductor storage are known, the storage cells of which consist of flip-flops with bopolar transistors and Schottky diodes as read/write coupling elements and the load elements of which are high-ohmic current sources. The read/write cycles of the storage cells, which are performed in several phases, are selected by level changes on the word and bit lines. For increasing the read and write speed as well as for reducing the power dissipation, the bit lines are discharged via the conductive storage cell transistors. Discharging of the bit lines via these conductive storage cell transistors is effected to ground. During the read phase of the storage, the bit lines are only slightly recharged, so that the recharge current flowing through the storage cell is very low.

In the past few years, there have been many developments in the field of logic arrays and integrated semiconductor storage technology with bipolar transistors, which are referred to as MTL (Merged Transistor Logic) or I²L (Integrated Injection Logic) in the literature. In this connection, attention is drawn, for example, to articles in the IEEE Journal of Solid State Circuits, Vol. SC/7, No. 5, October 1972, pp. 340 ff. and 346 ff. Corresponding proposals are also contained in U.S. Pat. No. 3,736,477 as well as U.S. Pat. No. 3,816,748.

These concepts with bipolar transistors have short switching times and are particularly suitable for extremely highly integrated storages and logic circuit groups.

Store with storage cells of bipolar transistors having a structure resembling that of MTLs necessitate a recharging of bit data and/or control line capacitances for selecting a storage cell. For this purpose, the voltage swing of the bit lines approximately corresponds to the voltage swing of the selected word lines. As previously described in U.S. Pat. No. 4,090,255, the capacitive discharge currents are discharged to ground via the storage cells of the selected word line and via the word line driver. With a greater number of storage cells in a matrix this has the disadvantage that the area requirements of the driver switching circuits, the power dissipation for each driver, and the delay period occurring during the selection of the word line increase disproportionately, so that the advantages of the MTL structure employed would be eliminated.

To avoid this disadvantage, German Offenlegungsschrift No. 28 55 866 proposes a method of driving a semiconductor storage and a circuit arrangement. [German Offenlegungsschrift No. 28 55 866 corresponds to U.S. Pat. No. 4,280,021, entitled "Method and Circuit Arrangement for Controlling An Integrated Semiconductor Memory" filed Dec. 7, 1979 by Klaus Heuber and Siegfried Kurt Wiedmann, and granted July 21, 1981.] This method is characterized in that in due time piror to selection, a control arrangement known per se generates control signals for the storage matrix as a function of a selection signal. These control signals are simultaneously applied to a discharge circuit, common to all storage cells, and to switching transistors which are thus switched on. As a result, the discharge currents of the line capacitances on the bit data and control lines flow through the switching transistors, being jointly discharged via the discharge circuit. This circuit arrangement is characterized in that the bit lines within the storage matrix are connected to a discharge line which, in turn, is connected to a discharge circuit, and that for control purposes, the discharge circuit and all word and/or bit line switching transistors are connected via lines to a control logic controlled by the selection signal of the storage chip.

Semiconductor stores with cells of bipolar transistors have a structure similar to that of MTL and necessitate charging the bit data and/or control line capacities for storage cell selection. The voltage swing of the bit line capacities approximately corresponds to that of the selected word lines. As previously described, the capacitive discharge currents are discharged to ground through the storage cells of the selected word line and the word line driver. With a large number of storage cells in an array this has the disadvantage that the area requirements of the driver circuits, the power dissipation of each driver and the delay time during word line selection become excessive, eliminating the advantages of the MTL structure used. Therefore, German Pat. No. 29 26 050 describes a method of and a circuit arrangement for reading and writing an integrated semiconductor storage, whose storage cells consist of flip-flops with bipolar transistors in MTL technology, wherein for or during a read or write operation line capacities are discharged and a read/write circuit is provided, wherein the current required for reading and/or writing the storage cells is generated by discharging only the input capacities of the non-selected storage cells and directly applied to the selected storage cells for reading and/or writing. For this purpose, in particular the discharge currents of the bit line capacities are used for reading and/or writing a selected storage cell. The discharge currents from the bit line and injector junction capacities of the selected storage cell charge the injector diffusion capacities, and these diffusion capacities are discharged much more rapidly on the OFF than on the ON side, so that the read signal is the difference signal resulting from discharging the capacities on the output and the input side at different speeds. [German Patent 29 26 050 corresponds to U.S. Pat. No. 4,330,853 entitled "Method of And Circuit Arrangement For Reading And/Or Writing An Integrated Semiconductor Storage With Storage Cells in MTL(I²L) Technology" granted May 18, 1982 to H. H. Heimeier et al.]

However, this read scheme (U.S. Pat. No. 4,330,853) has the disadvantage that the read signal thus obtained is not an optimum one, as charging of the bit line PNP transistors is not controlled.

SUMMARY OF THE INVENTION

Therefore, it is the object of the invention to provide a method of and a circuit arrangement for reading an integrated semiconductor store, whose storage cells consist of flip-flops with bipolar transistors in MTL technology, wherein stronger and faster read signals are generated by utilizing the different effective storage time constants and by charging the bit line PNP transistors as required.

With regard to the method, the solution in accordance with the invention may be summarized as set forth in numbered paragraphs 1, 2 and 3 below:

No. 1. A method of reading an integrated semiconductor storage, whose storage cells consist of flip-flops in MTL technology with bipolar transistors, wherein prior to or during a read operation, line capacities are discharged and in addition to the word line drivers and the bit line drivers, a read/write circuit is provided, characterized in that simultaneously with the selection of a word line (WL), or with a slight time delay (t1), two identical current sources (IRDO) are connected by means of two switches (S0 and S1) to the relevant bit line (B0 and B1), that as a result, the two injectors of the two bit line PNP transistors (T1 and T4) are supplied with the same currents, that after a second time phase (t2), the current sources (IRDO) are switched off so that the duration of the second time phase (t2) considerably exceeds the storage time constant ($\tau e$) of the bit line PNP transistor (T4) coupled to the switched off NPN transistor (T3) of the cell (C0), that the effective storage time constant ($\tau SAT$) of the bit line PNP transistor (T1), connected to the switched on NPN cell transistor (T2), considerably exceeds the storage time constant ($\tau e$), that the discharge phase for the charges Q1 and Q4, respectively, is effected in a third phase (t3) in such a manner that the charge (Q4) of the bit line PNP transistor (T4) is almost discharged, while the higher storage charge (Q1) of the other bit line PNP transistor (C1) is discharged at a much slower rate according to the different time constants ($\tau e$ and $\tau SAT$), thus generating a very fast and high output signal ($\Delta VBL = VS$).

No. 2. The method according to paragraph No. 1, supra characterized in that immediately following the third phase (t3), the voltage on the word line (WL) is relatively rapidly returned to the original level, that the injectors of the bit line PNP transistors (T1 and T4) are suddenly switched off and the residual charges (Q1 and Q4) recharge the bit line capacities (CPL), with the voltage difference of the bit lines (B1, B0) being the greater, the higher the residual charge (Q1) of one of the bit line PNP transistors (T1) is.

No. 3. The method according to paragraph No. 1 or No. 2, (supra) characterized in that charging is effected in two steps at a relatively short peak current (IBL).

As for the circuit arrangement required for implementing the method, the solution in accordance with the invention may be summarized as set forth in numbered paragraphs 4 through 7 below:

No. 4. A circuit arrangement for implementing the method according to paragraph Nos. 1, 2, or 3, supra, characterized in that the bit lines (B0 and B1) are connected by switches (S0, S1) to one current source (IRDO) each, that two-phase control signals (phases t1 and t2) are applied to the control inputs of the switches (S0, S1), while a three-phase word line selection signal (WSEL for the phases t1 to t3) is applied to the input of the word line driver.

No. 5. The circuit arrangement according to paragraph No. 4, characterized in that the bit lines (B0, B1) are terminated by a different amplifier (DV) which has a high input resistance during the charging phases (t2 and t3).

No. 6. The circuit arrangement according to paragraph Nos. 4 and 5 characterized in that during the time (t3) of the discharge phase, the word line (WL) is not kept at a constant but at a floating potential.

No. 7. The circuit arrangement according to paragraph Nos. 4, 5, or 6, characterized in that the charge current (IB0 and IB1, respectively) consists of an AC and/or a DC current.

The advantage of the read scheme in accordance with the invention and the appertaining circuit is that by charging the bit line PNP transistors as required and by utilizing different effective storage time constants as required, without special components becoming necessary for the circuit, stronger and faster read signals can be generated. In addition, a relatively high parasitic read current is permissible for the non-selected storage cells. The restore operation which is generally technically difficult, becomes less critical, although the complexity of the circuit on the whole is reduced. Moreover, the read operation is not greatly affected by different current amplification parameters of the PNP transistors, and relatively great tolerances of the storage cell and control circuits do not make reading less reliable. In addition, the supply of the standby current and the write operation may be effected in a known manner.

BRIEF DESCRIPTION OF THE DRAWINGS

These and other objects, features and advantages of the invention will be apparent from the following more particular description of the preferred embodiment of the invention as illustrated in the drawings.

The invention will be described in detail below by means of an embodiment shown in the accompanying drawings.

FIG. 1 shows a section of an MTL store, at the crossings of whose word lines WL and bit lines B0 and B1 storage cells C are arranged. FIG. 1 shows only one word line WL and one bit line pair B0, B1. The bit line B0 is connected to a current source IRD0 by a switch S0 and the bit line B1 to a current source IRD0 by a switch S1. Both bit lines B0 and B1 are terminated by a difference amplifier DV. Storage cells C0 to Cn, of which only storage cell C0 is shown in detail in FIG. 1, are arranged between the switches S0, S1 and the difference amplifier. For storage cells C1 to Cn only the connections are schematically represented. The storage cell C0 shown in detail consists of the PNP transistors T1 and T4 connecting the two cross-coupled NPN transistors T2 and T3 of the storage cell C0 to the bit lines B0 and B1, respectively. The injector electrode of the PNP transistors T1 and T4 and the emitters of the NPN transistors T2 and T3 are connected to the word line WL with which, as is schematically represented, further storage cells belonging to a word are linked.

Before describing the operation of the diagram according to FIG. 1, the pulse diagram of FIG. 2 will be explained in principle.

The top-most waveform shows the voltage curve on the word line, with 0.5 V corresponding to the standby state and 0 V to the selected state. Below these are shown the currents IB0 and IB1 on the bit lines B0 and B1, below these the voltages VB0 and VB1 which occur at the inputs of the difference amplifiers DV, and below the latter the difference signal $\Delta VBL$.

Figure 2:
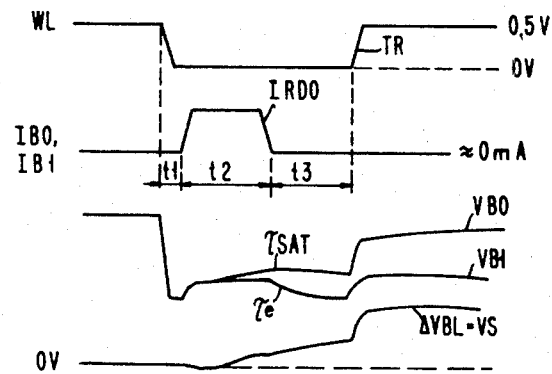
FIG. 2 is the basic time diagram of the control pulses for the read scheme when the PNP storage loads are controllably charged as required.

The pulse diagram of FIG. 2 is subject to the following time conditions:

$$t1 \leq 0$$

$$\tau SAT \lesssim t2 > \tau e$$

$$\tau SAT > t3 \lesssim \tau e$$

[Where $\tau SAT$ is the storage time constant of the PNP transistor (T1 or T4) connected to the switched "ON" NPN transistor (T2 or T3) and $\tau e$ is the storage time constant of the PNP transistor (t4 or T1) connected to the switched "OFF" NPN transistor (T3 or T2)]

Figure 1:
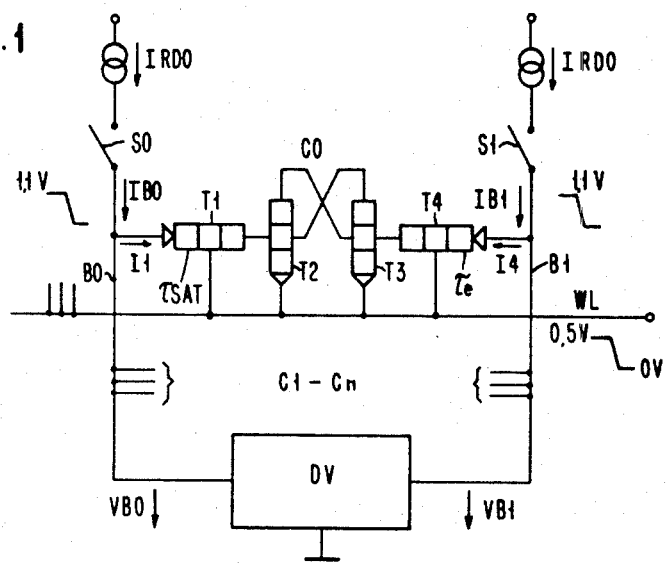
FIG. 1 is the basic circuit diagram with a selected storage cell.

The storage cell C0 shown in detail in the basic circuit diagram of FIG. 1 is assumed to be selected in this case. It is pointed out that the up level of the two voltage pulses shown in the circuit diagram corresponds to the standby state and the down level to the read state. Cell C0 at the bit line pair B0, B1 is selected in a known manner by a negative pulse (shown) on the word line WL. In this case, too, the upper level corresponds to the standby state with an unselected cell and the lower level to a selected cell. It is pointed out that the storage time constants of the PNP transistors are assumed as follows:

$$\tau SAT > \tau e.$$

At the same time or with a minimum delay time t1 (see FIG. 2), two identical current sources IRD0 are connected by means of the switches S0 and S1 to the bit lines B0 and B1, so that the two injectors of the two bit line PNP transistors T1 and T4 are supplied with the same currents. After the t2me t1 (see FIG. 2) has elapsed, the current sources IRD0 are switched off, the switching time being such and being controlled in such a manner that the following condition is fulfilled:

$$t2 >> \tau e.$$

$\tau e$ is the storage time constant of the PNP transistor T4 connected to the NPN transistor T3 which is in the OFF state.

As previously mentioned, the effective storage time constant $\tau SAT$ of the transistor T1, connected to the switched ON NPN transistor T2, has a much higher value ($\tau SAT >> \tau e$), since with the same current being applied the highly saturated PNP transistor T1 stores a considerably higher charge.

The charge stored in PNP transistor T4 after the time $t2 >> \tau e$ is $$Q4 \sim IRD0 \cdot \tau e.$$

However, the highly saturated PNP transistor T1 is capable of storing a much higher charge, namely, $$Q1 \sim IRDO \cdot \tau SAT$$

if the time t2 during which current is supplied exceeds the storage time constant $\tau SAT$. If the time of t2 is even longer, the charge Q1 no longer increases. To obtain as high a ratio as possible of the storage charges Q1 to Q4 of the two transistors T1 and T4, it is necessary to choose $$t2 >> \tau e.$$

On the other hand, t2 must not considerably exceed $\tau SAT$, as after that time the charge difference does not noticeably increase.

Then follows the second phase of the generation of the read signal. After the current sources IRDO have been switched off, the storage charges Q1 and Q4 are discharged. The discharging, similar to the charging, of the storage charges Q1 and Q4 depends on two different time constants $\tau e$ and $\tau SAT$. If the time t3 of the discharge phase is chosen longer than $\tau e$, charge Q4 of the PNP transistor T4 is almost completely discharged. The storage charge Q1 of the PNP transistor T1, which is higher anyhow at the beginning of the discharge phase, is discharged at a much slower rate. At $t3 < \tau SAT$, the greatest part of the charge Q1 of the PNP transistor still exists. By a discharge phase t3 thus controlled it is possible to considerably increase the ratio of the residual storage charges Q1 to Q4. If immediately following phase t3 the word line voltage is relatively rapidly restored to the original value (fast trailing edge TR on the word line WL in FIG. 2), then the injectors of the two bit line PNP transistors T1 and T4 are suddenly switched off, and the residual storage charges Q1 and Q4 recharge the bit line capacities. The voltage difference of the bit lines, which corresponds to the read signal $\Delta VBL$, is the greater the higher the residual charge Q1 and the charge ratio Q1 to Q4 are. By thus controlling the recharging of the injectors, a very high read signal $\Delta VBL$ is obtained after a relatively short time, i.e., after several time constants $\tau e$. With the read systems that have become known so far the time determinant is the much greater time constant $\tau SAT$, and the amplitude of the read signal is considerably smaller. Thus, a new read scheme has been described for MTL storage cells, which, compared with known read systems, permits a considerably improved read speed. In addition, a higher read voltage is obtained, so that a sufficiently high read signal is also available if the process parameter tolerances are unfavorable.

Figure 3:
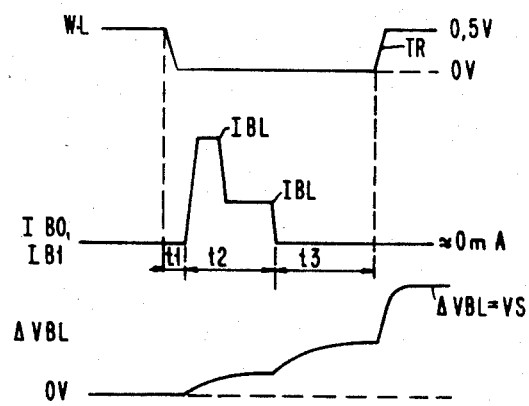
FIG. 3 is a pulse diagram for two-step charging.
Figure 4:
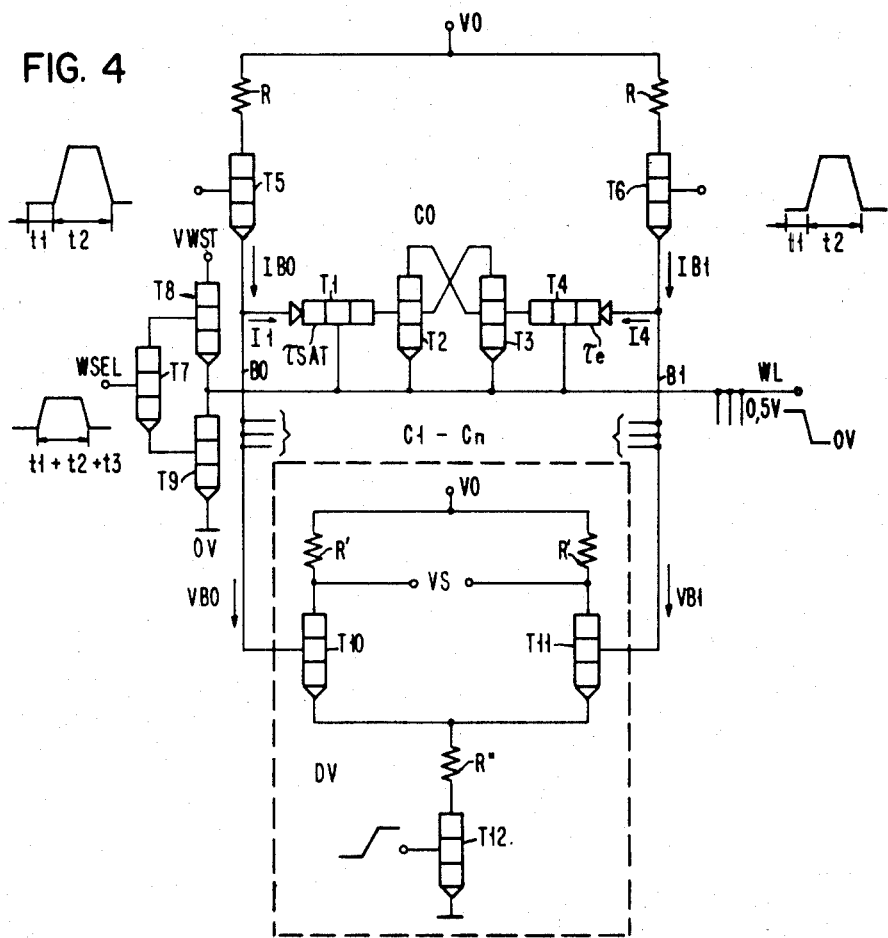
FIG. 4 is a further example of a circuit for the read scheme.

The pulse diagram of FIG. 3 shows a variant of the read scheme explained by means of FIGS. 1 and 2. In this case, two-step charging is effected at a relatively short peak current IBL (see center curve in the diagram), in order to reduce the time required for building up the storage charges. This diagram again shows the voltage curve on the word line WL, the current curve on the bit lines B0 and B1 as well as the time curve of the read signal $\Delta VBL = VS$. FIG. 4 is a detailed circuit diagram for the read scheme of MTL storage cells in accordance with the invention. Switches S0 and S1 are realized in this case by NPN transistors T5 and T6. Both transistors T5 and T6 have their emitter connected to the bit lines B0 and B1, respectively, whereas the collectors are connected by a resistor R to the common voltage node V0. The control signal necessary for reading is applied to the bases of these two transistors T5 and T6. The time phases t1 and t2 are represented. The word line WL is fed by a word driver consisting of the transistors T7 to T9. The word line selection pulse is applied to the input of the word driver, the base of transistor T7, for the time t1+t2+t3. The collector is connected to the base of transistor T8 and the emitter of transistor T7 to the base of transistor T9. The collector of transistor T8 is connected to the voltage for the word line in the standby state VWST and the emitter of transistor T9 to 0 V. The connection of the emitter of transistor T8 to the collector of transistor T9 is linked with the word line to which a number of cells, corresponding to a word, are connected.

The difference amplifier, shown as a block diagram in FIG. 1, consists in FIG. 4 of the transistors T10 and T12 and the resistors R' as well as R''. The base electrodes of transistors T10 and T11 are connected to the bit lines and the collectors of the two transistors T10 and T11 are each connected by one resistor R' to a common supply node V0. The output voltage VS, corresponding to the signal read, is emitted above the two collectors. The emitters of the two transistors T10 and T11 are jointly connected by a resistor R'' to the collector of a transistor T12, whose emitter is connected to ground and whose base electrode receives a read pulse. The operation of this circuit corresponds to that of the circuit shown in FIG. 1, so that it need not be described once more. It is pointed out, however, that the difference amplifier DV must have an input resistance that is as high as possible at least during the charging phases t2 and t3.

Figure 5:
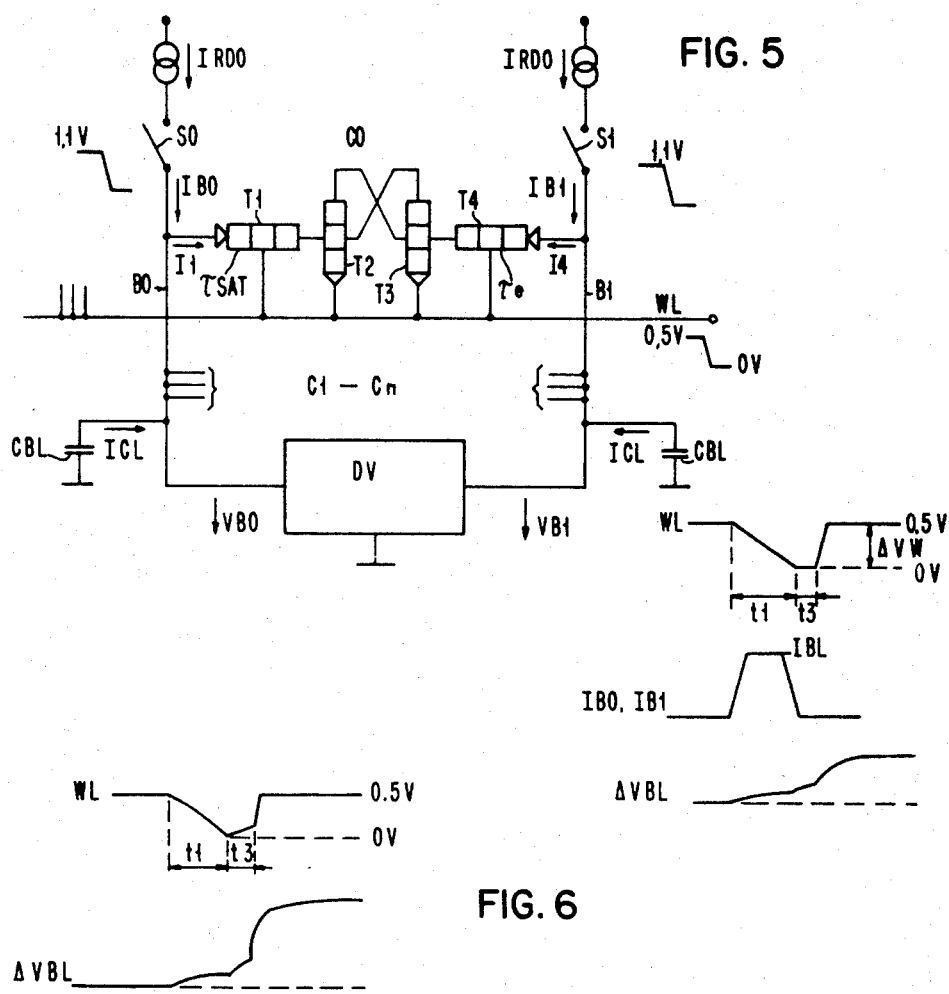
FIG. 5 is an equivalent circuit diagram of a storage cell for explaining a read scheme with capacitive bit line current.

FIG. 5 shows a further example with current and voltage curves on the word and the bit lines. The difference between this example and the circuits according to FIGS. 1 and 4 is that the charge current IB0 and IB1, respectively, may consist of an AC and/or a DC current component. For this reason the bit line current IBL equals IRO+ICL, with the capacities CBL supplying the current ICL constituting the bit line capacities. For this current the following holds:

$$ICL = CBL \cdot VW / \Delta t1.$$

Figure 6:
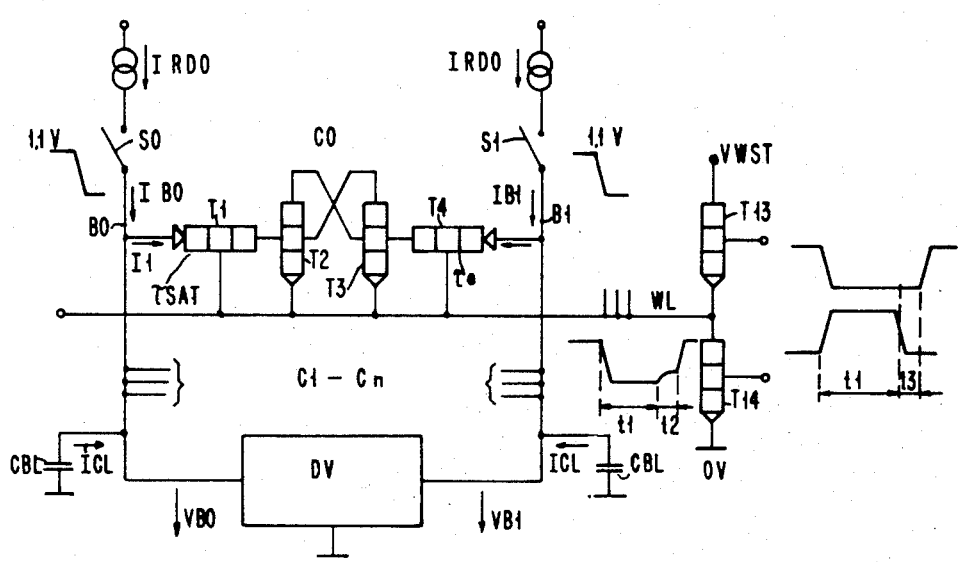
FIG. 6 is a further example of the read scheme of FIG. 5 with floating potential on the word line.

A favorable embodiment of the circuit according to FIG. 5 is shown in FIG. 6, with the word line driver consisting of the transistors T13 and T14. The input signals for the transistors T13 and T14 as well as the relevant signal on word line WL in the phases t1 to t3 are shown. With this circuit arrangement, the word line WL, in the case of the capacitive bit line current, is not kept at a constant potential during the discharge phase t3 but is left conductive. As a result, a higher charge ratio Q1/Q4 of the bit line coupling transistors T1 and T4 is achieved in a shorter time, as may be seen quite clearly from the pulse curve for $\Delta VBL$ below the circuit diagram.

The advantages of the read scheme and the circuit required therefor are summarized below:
1. A high read signal is obtained at a higher speed than has previously been possible.
2. A relatively high parasitic read current is permissible for the non-selected cells in an array, rendering the restore operation less critical.

3. Different current amplification parameters (tracking) of the PNP transistors do not adversely affect the read operations.
4. Relatively great tolerances are possible both in the storage cells and the control circuits, without jeopardizing the read function from a signal or speed standpoint.
5. Faster and better read signals are obtained by a circuit of little complexity.

Finally, it is pointed out that the standby current supply and the write operation for the store can be effected without any difficulty with the aid of known methods.

While the invention has been particularly shown and described with reference to a preferred embodiment thereof, it will be understood by those skilled in the art that various changes in form and details may be made therein without departing from the spirit and scope of the invention.

We claim:

1. A method for reading at least one I$^2$L memory cell in an integrated solid state memory having a plurality of I$^2$L memory cells, each of said cells being coupled to a wordline and a pair of bit lines, said memory including a first I$^2$L memory cell (C0), said first I$^2$L memory cell having a first stable state (ST1) and a second stable state (ST2) and being in either said first stable state (ST1) or said second stable state (ST2), a first pair of bit lines (B0, B1), a first word line (WL) and a first difference amplifier (DV), said first I$^2$L memory cell (C0) including a first (PNP) transistor (T1) having an emitter, base and collector, a second (NPN) transistor (T2) having an emitter, base and collector, a third (NPN) transistor (T3) having an emitter, base and collector and a fourth (PNP) transistor (T4) having an emitter, base and collector, said emitter of said first transistor (T1) being connected to a first bit line (B0) of said first pair of bit lines (B0, B1), said emitter of said fourth transistor (T4) being connected to said second bit line (B1) of said first pair of bit lines (B0, B1), said base of said first transistor (T1) and said emitter of said second transistor (T2) being formed in common and connected to said first word line (WL), said base of said fourth transistor (T4) and said emitter of said third transistor (T3) being formed in common and connected to said first word line, said collector of said first transistor (T1) being formed in common with said base of said second transistor (T2) and connected to said collector of said third transistor (T3), said collector of said fourth transistor (T4) being formed in common with said base of said third transistor (T3) and connected to said collector of said second transistor (T2), said first difference amplifier (DV) having a first input connected to said first bit line (B0) of said first bit line pair (B0, B1) and a second input connected to said second bit line (B1) of said first bit line pair (B0, B1) and an output (VS), a first controllable voltage source connected to said first word line (WL), first and second controllable current source means respectively connected to said first bit line (B0) and said second bit line (B1) of said first bit line pair (B0, B1), said method comprising the following steps in the order recited;

(1) utilizing said first controllable voltage source to lower the voltage on the first word line (WL) for a predetermined time period having a time of origin and a time of termination;
   (2) utilizing said first and second controllable current sources for impressing, concurrent with, or subsequent in time to said time of origin of the lowering of said voltage on said first word line (WL), first and second currents respectively on said first and second bit lines of said first bit line pair (B0, B1);
   (3) utilizing said first and second controllable current sources, at a time prior to the termination time of the lowered voltage on said first word line (WL), to terminate said first and second currents respectively impressed on said first and second bit lines of said first bit line pair (B0, B1); and,
   (4) utilizing said first difference amplifier connected to said first bit line pair (B0, B1) to provide an electrical signal indicating whether said first I$^2$L cell (C0) is in said first stable state (ST1) or said second stable state (ST2).

2. A method of reading an I$^2$L memory cell where said cell is in either a first stable state or a second stable state, said cell, prior to being read, being maintained in either said first stable state or said second stable state by being provided with electrical energy having a fixed magnitude, said cell being connected between a pair of bit lines and a word line in a solid state memory, said method comprising the following steps in the order recited:

(1) utilizing said pair of bit lines and said word line to increase the magnitude of the electrical energy provided to said cell for a first predetermined period of time, said first predetermined time period having a time of origin and a time of termination;
   (2) utilizing said pair of bit lines and responsive to said increase in the magnitude of the electrical energy provided to said cell, sense the electrical energy stored by said cell to determine whether said cell is in said first stable state or in said second stable state; and, said method being characterized by the afore recited step (1) including, in the order recited, the following substeps,
   (1a) lowering the potential impressed on said word line for said first predetermined time period, and
   (1b) impressing an increased current on each of said bit lines for a second predetermined time period, said second predetermined time period being shorter in duration that said first predetermined time period and said second predetermined time period wholly occurring within said first predetermined time period.

* * * * *